(12) United States Patent
Yamada (10) Patent No.: US 6,533,595 B2
(45) Date of Patent: *Mar. 18, 2003

(54) SOCKET FOR ELECTRICAL PARTS (75) Inventor: Takayuki Yamada, Kawaguchi (JP)

(73) Assignee: Enplas Corporation, Saitama-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/258,035

(22) Filed: Feb. 25, 1999

(65) Prior Publication Data

US 2001/0014550 A1 Aug. 16, 2001

(30) Foreign Application Priority Data

Feb. 25, 1998 (JP) ............................... 10-062227

(51) Int. Cl.$^7$ ................................................ H01R 11/22
(52) U.S. Cl. ....................................... 439/266; 439/331
(58) Field of Search .................... 439/266, 72, 73, 439/330, 331, 525, 526, 267, 71, 264, 259, 265

(56) References Cited

U.S. PATENT DOCUMENTS 5,108,302 A * 4/1992 Pfaff .......................... 439/266
5,352,131 A * 10/1994 Nagumo .................... 439/266
5,443,396 A * 8/1995 Tokushige .................. 439/266
5,700,155 A * 12/1997 Matsuoka .................. 439/266

FOREIGN PATENT DOCUMENTS

JP            2572191       3/1998      ........... H01R/33/76

* cited by examiner

Primary Examiner—P. Austin Bradley
Assistant Examiner—Ross Gushi
(74) Attorney, Agent, or Firm—Fish & Richardson P.C.

(57) ABSTRACT

A socket, such as IC socket, for an electrical part such as IC package comprises a socket body having a mount portion on which an electrical part having terminals is mounted, a plurality of contact pins arranged to the socket body and having an elastic property adapted to contact and separate from the terminals of the electrical part, and an upper operation member arranged for the socket body to be vertically movable in a mounted state and having substantially a rectangular frame shape. Each of the contact pins is formed with a movable contact piece contacting the terminal of the electrical part, and the movable contact pin is deformed by the vertical movement of the operation member so as to contact and separate from the terminal. At least one of the operation member and the socket body is provided with a deformation restriction means, and the deformation restriction means is adapted to abut against at least another one of the operation member and the socket body at a time when the operation member takes most lowered position and restrict inward or outward deformation of the operation member due to a replusive force of the contact pin.

10 Claims, 5 Drawing Sheets

SOCKET FOR ELECTRICAL PARTS

BACKGROUND OF THE INVENTION

1. Field of the Invention

The present invention relates to a socket for electrical parts for detachably holding an electrical part such as semiconductor device, which is called herein as "IC package", and more particularly, a socket for electrical parts having improvement for restricting deformation of an upper operation member of the socket.

2. Prior Art of the Invention

A known socket for electrical parts of the type mentioned above includes an IC socket for holding an IC package as "electrical part".

Such IC package is so-called a gull-wing type, in which a plurality of IC leads as "terminals" projecting in crank-shape from two opposing side portions of a package body having substantially a rectangular shape.

The IC socket has a socket body which is provided with a mount portion on which the IC package having substantially a rectangular shape is mounted and guide portions located at portions corresponding to four corner portions of the rectangular IC package, the guide portions being adapted to position the IC package at a predetermined position. A partition wall section is also formed to the peripheral portion of the mount portion so as to project upward, the partition wall section being formed with a plurality of slits with a predetermined pitch.

The socket body is provided with a plurality of elastically deformable contact pins which are contacted to or separated from the IC leads of the IC package, respectively. The contact pins have movable contact pieces adapted to contact or separate from the upper surfaces of the IC leads, and the movable contact pieces are inserted, respectively, into the slits formed to the partition wall section.

The socket body is also provided with an upper operation (control) member to be vertically movable in an operative state. The upper operation member of the conventional structure provides a frame-like rectangular shape having opposing two sides to which cap portions are formed. When the upper operation member is lowered against the urging force of the contact pins, operation pieces of the contact pins are pressed outward by the cam portions of the upper operation member, whereby springy (elastic) portions of the contact pins are elastically deformed thereby to separate the movable contact pieces from the IC leads. On the other hand, when the upper operation member is moved upward, the movable contact pieces are returned by the spring (elastic) force of the springy portions of the contact pins and then contact the upper surfaces of the IC leads thereby to press downward the IC leads, thus establishing an electrical connection between the contact pins and the IC leads, respectively.

In the conventional IC socket of the structure mentioned above, however, since a plurality of the contact pins are elastically deformable by the cam portions formed to the upper operation member, repulsive force will act on the opposing two side portions of the upper operation member along the entire portions thereof, which results in that the respective side portions will be bent or flexed inward, and more particularly, at the central portions of the side portions, amounts of openings of the contact pins will be reduced by such flexure of these side portions, thus providing a problem. In order to obviate such problem, an attempt to make large the thickness of the upper operation member may be considered, which, however, results in an increased size and an increased weight of the whole apparatus, further involving cost increasing, thus being inconvenient.

SUMMARY OF THE INVENTION

An object of the present invention is to substantially eliminate problems or defects encountered in the prior art mentioned above and to provide a socket for electrical parts capable of restricting a deformation of an upper operation member when a replusive force is applied from contact pins.

This and other objects can be achieved according to the present invention by providing a socket for an electrical part comprising:

a socket body having a mount portion on which an electrical part having terminals is mounted;

a plurality of contact pins arranged to the socket body and having an elastic property adapted to contact and separate from the terminals of the electrical part; and an operation member arranged for the socket body to be vertically movable in a mounted state, the operation member having substantially a rectangular frame shape, each of the contact pins being formed with a movable contact piece contacting the terminal of the electrical part, the movable contact pin being deformed by the vertical movement of the operation member so as to contact and separate from the terminal, wherein at least one of the operation member and the socket body is provided with a deformation restriction means, the deformation restriction means being adapted to abut against at least another one of the operation member and the socket body at a time when the operation member takes most lowered position and restrict inward or outward deformation of the operation member due to a replusive force of the contact pin.

In preferred embodiments, the deformation restriction means comprises a rib member formed to an inside portion fo the rectangular operation member and adapted to abut against the socket body at a time of lowering the operation member and to restrict an inward deformation of the operation member from occurring. The deformation restriction rib is formed to substantially a central portion in a longitudinal direction of a long side portion of the rectangular operation member.

A plurality of deformation restriction ribs are formed to substantially central portions in a longitudinal direction of opposing long side portions of the rectangular operation member. Each of said deformation restriction ribs is formed with an inclined surface portion and a perpendicular surface portion which slide along a wall section of the socket body when the operation member is lowered. The movable contact piece is inserted between the deformation restriction ribs.

The deformation restriction rib has an extension which slides along a wall section of the socket body even when the operation member takes an upward moved position.

The deformation restriction rib has a front end formed so as to provide a round shape.

The socket of the structure mentioned above will be preferably applied to an IC socket.

According to the structure and characters of the present invention mentioned above, since the socket is provided with a deformation restriction means, for example, in shape of rib, the deformation of the upper operation member, when lowered, can be effectively restricted or prevented from occurring and, moreover, the opening amount of the contact pins can be ensured without making large the entire structure of the device, i.e. socket.

More specifically, since the deformation restriction ribs may be preferably formed to the central portion of the long side portion, at which the deformation will be most remarkably caused, of the rectangular upper operation member, the deformation of the upper operation member can be more surely restricted, thus being effective and advantageous.

The nature and further characteristic features of the present invention will be made more clear from the following descriptions made with reference to the accompanying drawings.

DESCRIPTION OF THE PREFERRED EMBODIMENTS

First Embodiment

FIGS. 1 to 6 represent a first embodiment of the present invention.

Referring to FIGS. 1 to 6, an IC socket as "socket for electrical parts" of the present invention is by a reference numeral 11, and the IC socket 11 is adapted to establish an electrical connection between IC leads 12b as "terminals" of an IC package 12 and a printed circuit board, not shown, of a measuring device such as tester for carrying out a performance test of the IC package 12 as "electrical part".

Figure 1:
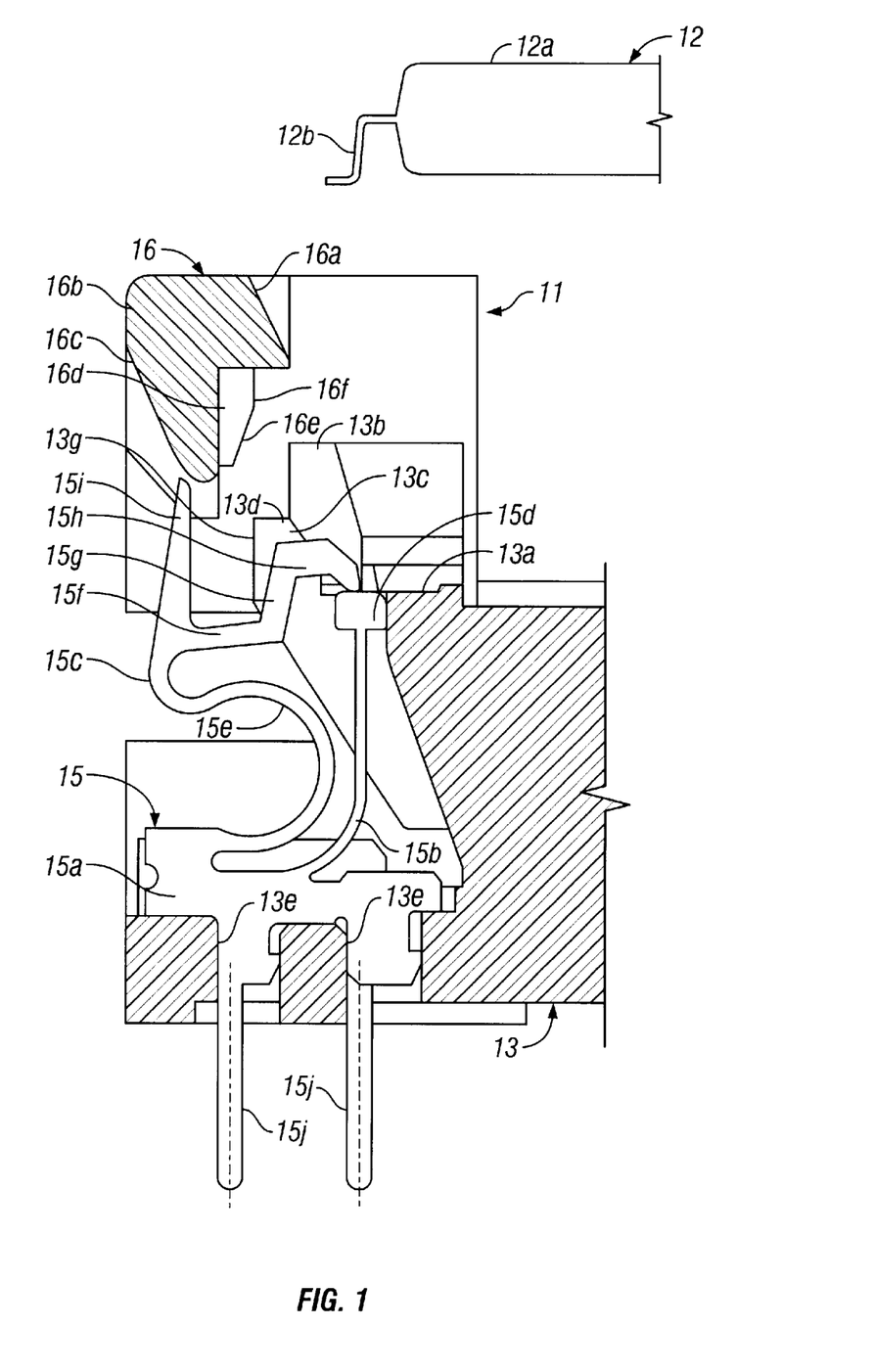
FIG. 1 is a sectional view of an IC socket according to a first embodiment of the present invention, in which only a left-half thereof is illustrated.

The IC package 12 is so-called a gull-wing type having substantially a rectangular shape such as shown in FIG. 1, in which a plurality of IC leads 12b projecting, in crank-shape, towards side portions from opposing two side portions of the rectangular IC package 12a.

The IC socket 11 is provided with a socket body 13 to be mounted on the printed circuit board and also provided with a mount portion 13a on which the IC package 12 is mounted. The IC socket 11 is further formed with guide portions 13b for positioning the IC package 12 to a predetermined position, the guide portions 13b being arranged at portions corresponding to corner portions of the rectangular package body 12a of the IC package 12. Furthermore, partition wall sections 13c are formed to opposing two side portions of the periphery of the mount portion 13a between the respective guide portions 13b, and a plurality of slits 13d are formed to the partition wall sections 13c with a predetermined space between the adjacent slits 13d.

Furthermore, a plurality of elastically deformable contact pins 15, which are contacted to or separated from the IC leads 12b, are arranged to the socket body 13, and these contact pins 15 are elastically deformed by an upper operation member 16 having a rectangular frame-like structure is disposed to be vertically movable.

The contact pins 15 have a springy (elastic) property, as shown in FIG. 1, formed of a material having a good electrically conductive property, and are press-fitted to an outside portion of the mount portion 13a of the socket body 13.

More specifically, a lower portion of each of the contact pins 15 is formed as a fixing portion 15a to be fixed to the socket body 13, and the fixing portion 15a is press-fitted into an opening 13e of the socket body 13 and fixed thereto. A stationary contact piece 15b and a movable contact piece 15c are project upward from the fixing portion 15a. The stationary contact piece 15b has a fixing side contact portion 15d which abuts against the lower surface of the IC lead 12b.

The movable contact piece 15c has a springy (elastic) portion 15e bent in an arcuate shape and a horizontal portion 15f is formed to an upper portion of the springy portion 15e so as to extend substantially horizontally towards the central portion of the socket body 13. An inclined portion 15g is also formed so as to extend obliquely upward from the horizontal portion 15f, and a movable side contact portion 15h is further formed so as to extend horizontally from the upper portion of the inclined portion 15g towards the central portion of the socket body 13. The movable side contact portion 15h of the movable contact piece 15c abuts against the upper surface of the IC lead 12b and depresses the same thereby to held the IC lead 12b between the stationary side contact portion 15d and the movable side contact portion 15h.

The contact pin 15 is further formed with an operation piece 15i to be pressed down by an upper operation (control) member 16 so as to separate from the horizontal portion 15f and extend upward.

Lead pieces 15j are arranged to the lower side portion of the fixing portion 15a so as to be connected to the printed circuit board, not shown.

Figure 3:
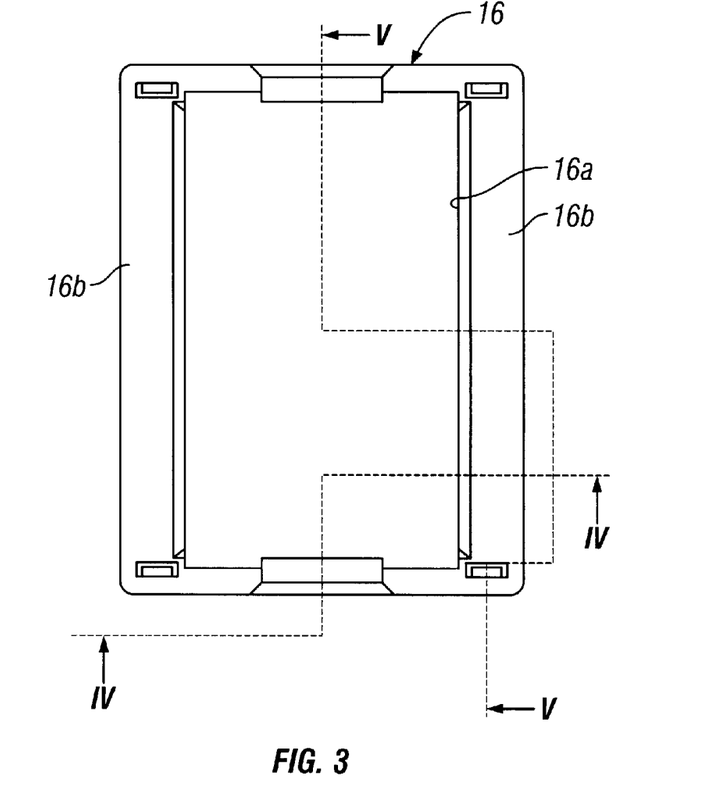
FIG. 3 is a plan view of the upper operation member in FIG. 1.

As shown in FIGS. 1 and 3, the upper operation member 16 has a rectangular frame-like shape corresponding to the shape of the IC package 12 and is provided with an opening 16a having a size allowing the IC package 12 to be inserted. The IC package 12 inserted into the opening 16a is then mounted on the upper, as viewed, side of the mount portion 13a of the socket body 13.

Figure 4:
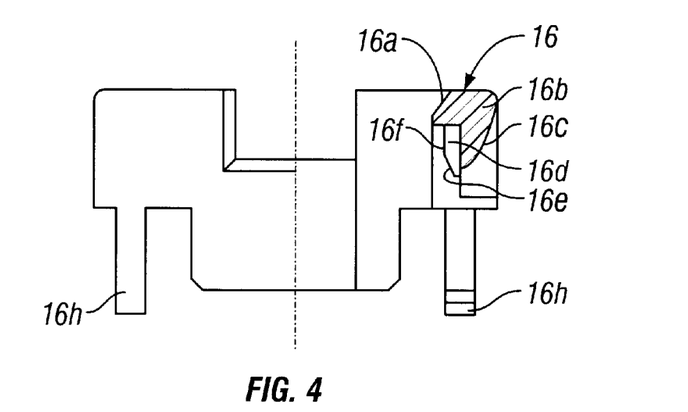
FIG. 4 is a sectional view taken along the line IV—IV in FIG. 3.
Figure 5:
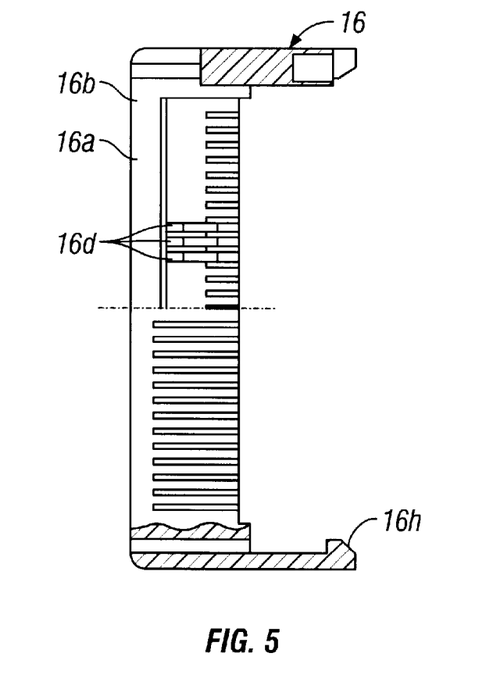
FIG. 5 is a sectional view taken along the line V—V in FIG. 3.

The upper operation member 16 is arranged to be vertically movable with respect to the socket body 13 and urged upward by means of contact pins 15. The operation member 16 is formed with an engaging claw 16h and when the upper operation member 16 is moved to the most upward position, the engaging claw 16h is engaged with an engaging portion of the socket body 13 as shown in FIG. 4 thereby to lock the upper operation member 16 at that position.

Figure 2:
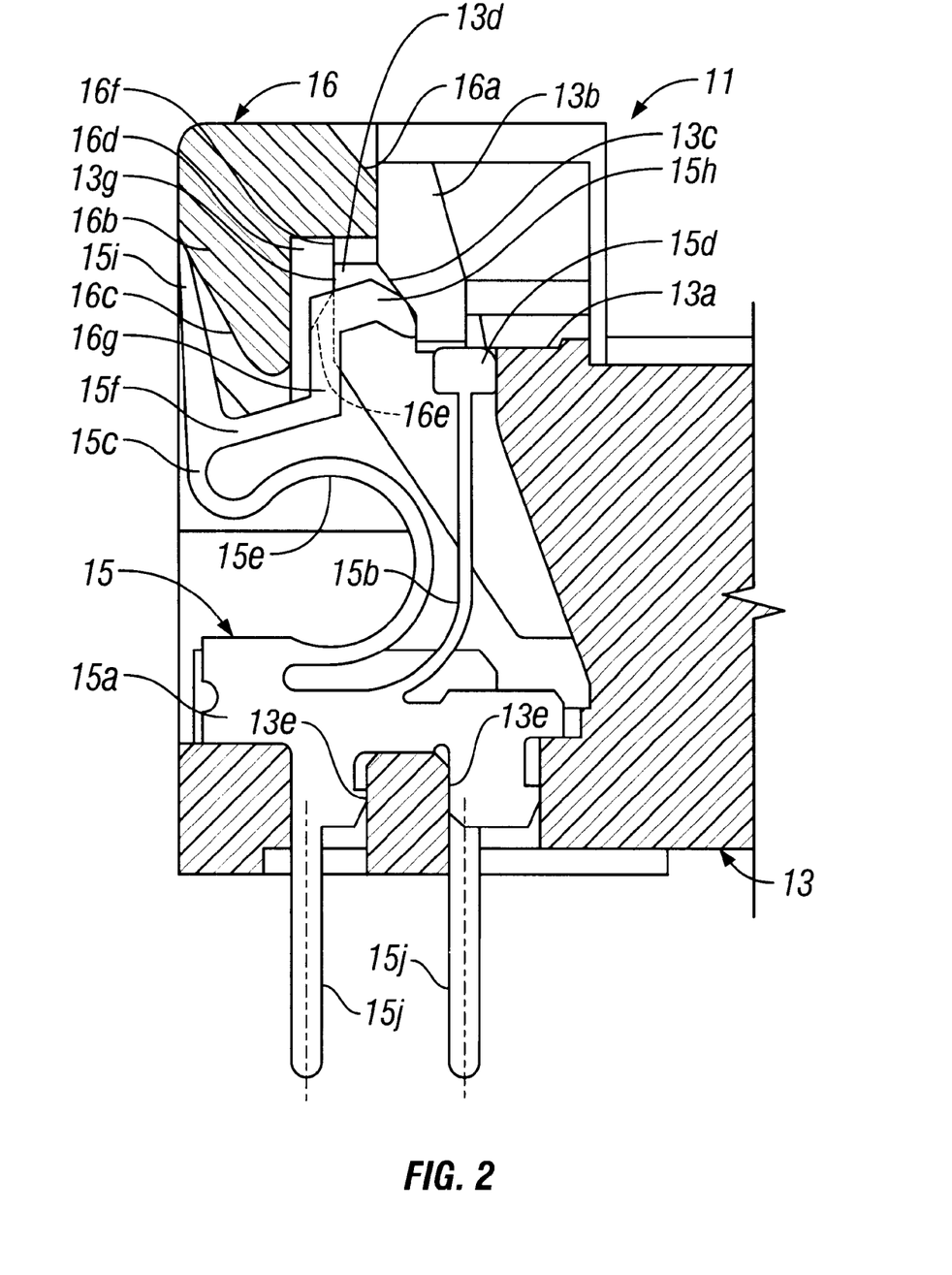
FIG. 2 is a sectional view similar to that of FIG. 1, showing a state that an upper operation member of the IC socket is forced in by a maximum amount.

Furthermore, the upper operation member 16 is formed, at outer side surfaces of opposing long side portions 16b of the rectangular structure thereof, with cam portions 16c adapted to slidably contact the operation pieces 15i of the contact pins 15. Then, when the upper operation member 16 is moved downward, the operation pieces 15i of the contact pins 15 are pressed by the cam portions 16c thereby to elastically deform the springy portions 15e, whereby the movable side contact portions 15h of the contact pins 15 are deformed obliquely outward as shown in FIG. 2.

Figure 6:
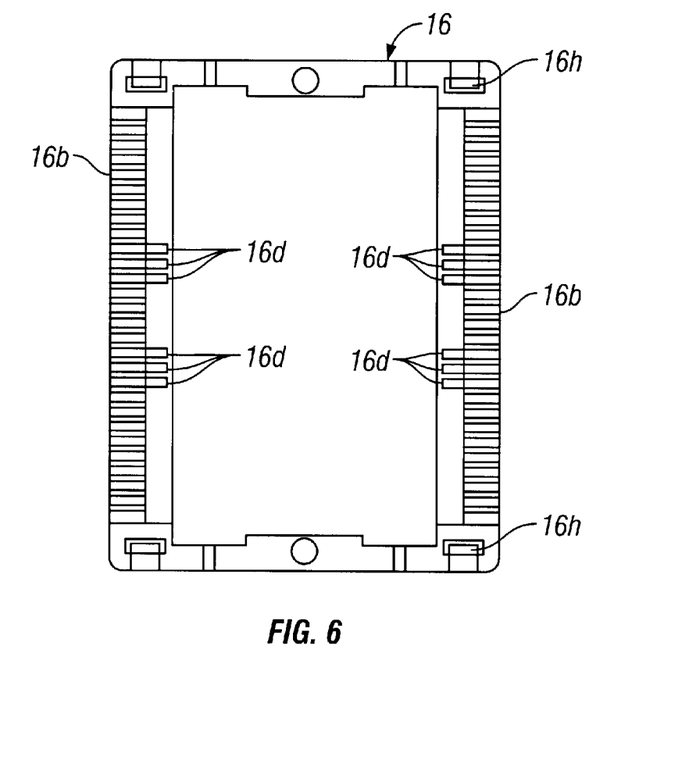
FIG. 6 is a view of the upper operation member viewed from a rear side.

Still furthermore, the upper operation member 16 is formed, at the long side portions 16b thereof, with a plurality of deformation restriction ribs 16d for restricting the inward deformation of the long side portions 16b due to a replusive force of the contact pins 15. The deformation restriction ribs 16d are formed in two sets, as shown in FIG. 6, each including three ribs, at portions near the longitudinally central portions of the inner surface side of the long side portions 16d of the rectangular operation member 16. As shown in FIG. 1, the deformation restriction rib 16d has an inclined surface portion 16e and a perpendicular surface portion 16f, which are slidable along the partition wall sections 13c of the socket body 13 when the upper operation member 16 is lowered, thereby restricting the long side positions 16b of the upper operation member 16 from being flexed and deformed inward. Further, the movable contact pieces 15c of the contact pins 15 are inserted between the respective deformation restriction ribs 16d.

The IC socket 11 of the structure mentioned above will be used in the following manner.

First, a plurality of contact pins 15 are arranged on the printed circuit board by inserting the lead portions 15j of the contact pins 15 into through holes formed to the printed circuit board and then soldering the same. Then, the IC package 12 is mounted by an automatic machine, for example, for establishing the electrical connection between the IC package and the printed circuit board in a manner described hereunder.

That is, the upper operation member 16 is pressed downward and then lowered against the urging force of the contact pins 15, by the automatic machine, with the IC package 12 being held in the state mentioned above. At this time, the operation pieces 15i of the contact pins 15 are pressed by the cam portions 16c of the upper operation member 16 and the springy portions 15e thereof are elastically deformed, whereby the movable side contact portions 15h are deformed obliquely upward to take the most opened positions and retired from the IC package 12 insertion region as shown in FIG. 2.

During this operation, although the long side portions 16b of the upper operation member 16 are pressed inward by the replusive force of the operation pieces 15i of the contact pins 15, the flexed deformation of these long side portions 16b at the most lowered position can be prevented, which is significantly different from the conventional structure of an IC socket, in the following manner.

That is, in a case where the upper operation member 16 is slightly flexed during the lowering thereof, the inclined surface portions 16e of the deformation restriction ribs 16d slidably contact the corner portions of the partition wall sections 13c of the socket body 13. Then, when the upper operation member 16 is further lowered, the perpendicular surface portions 16f of the deformation restriction ribs 16d slide the perpendicular surface portions 13g of the partition wall sections 13c of the socket body 13 as shown in FIG. 2. According to the abutment of the deformation restriction ribs 16d against the partition wall sections 13c, the repulsive force from the contact pins 15 is beared by the socket body 13 through the deformation restriction ribs 16d, so that the inward flexed deformation of the long side portions 16b of the upper operation member 16 can be restricted.

Accordingly, the deformation of the upper operation member 16 at the most lowered position (most inserted position) thereof can be suitably restricted without making large the entire thickness of the long side portions 16b of the upper operation member 16, so that the IC socket can be prevented from being enlarged in size and the suitable opened amounts of the movable side contact portions 15h can be ensured. Particularly, since the deformation restriction ribs 16d are formed to the portions near the longitudinal central portions of the long side portions 16b at which the deformation amount become most large, the arrangement of the deformation restriction ribs 16d at these portions can be effectively prevent the deformation of the upper operation member 16.

Under this state, the IC package 12 is released from the automatic machine and mounted on the mount portion 13a of the socket body 13.

In the next operation, when the pressing force of the automatic machine to the upper operation member 16 is released, the upper operation member 16 moves upward by the elastic force of the contact pins 15 and the movable contact pieces 15c of the contact pins 15 are returned to the original position by the springy force of the springy portion 15e. When the upper operation member 16 is moved upward and reaches the predetermined position, the respective movable contact portions 15h of the contact pins 15 abut against and contact the upper surfaces of the corresponding IC leads 12b of the IC package 12 which is now positioned, thus establishing the electrical connection therebetween.

Second Embodiment

Figure 7:
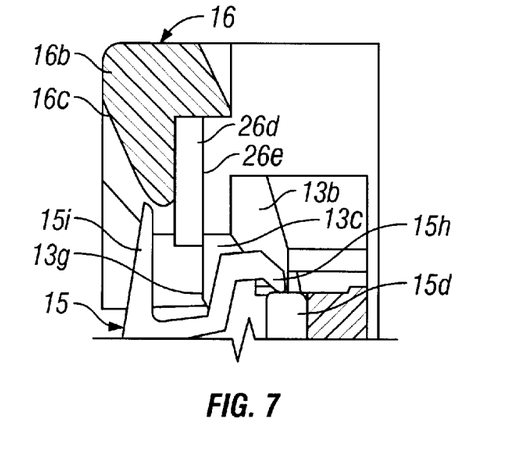
FIG. 7 is a sectional view showing a main portion of an IC socket according to a second embodiment of the present invention.

FIG. 7 represents a second embodiment of the present invention.

This embodiment differs in the structure of deformation restriction ribs 26d from that of the ribs 16d of the first embodiment.

That is, the deformation restriction rib 26d of this embodiment has a downward extending portion in comparison with the deformation restriction rib 16d, and even at a time when the upper operation member 16 takes its most upward position, a perpendicular surface portion 26e of the deformation restriction rib 26d slidably contact the perpendicular surface of the partition wall section 13c of the socket body 13.

According to such structure, in the state before the upper operation member 16 starts to be lowered, it has already been guided to the socket body 13, thus achieving an improved guiding function during the upward and downward moving of the upper operation member 16 as well as the function of preventing the deformation of the long side portions 16b of the upper operation member.

The other structures and functions of the second embodiment are substantially the same as those of the first embodiment, so that the details thereof are omitted herein.

Third Embodiment

Figure 8:
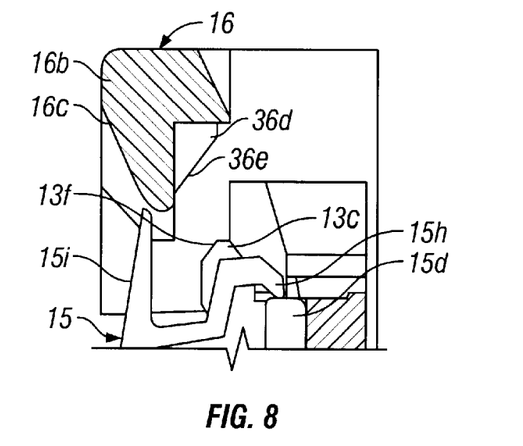
FIG. 8 is a sectional view showing a main portion of an IC socket according to a third embodiment of the present invention.

FIG. 8 represents a third embodiment of the present invention.

In this embodiment, the upper operation member 16 is provided with deformation restriction ribs 36d having an inclined surface portion 36e, and the partition wall sections 13c of the socket body 13 is also formed with an inclined surface portions 13f.

According to such structure, as the long side portions 16b of the upper operation member 16 is flexed and deformed inward, the inclined surface portions 36e of the deformation restriction ribs 36d slidably contact the inclined surface portions 13f of the partition wall sections 13c of the socket body 13 just before the most lowered position of the upper operation member 16. When the upper operation member 16 is moved further downward, the inclined surface portions 36e of the deformation restriction ribs 36d slide along the inclined surface portions 13f of the partition wall sections 13c, thereby restricting the long side portions 16b of the upper operation member 16 from being flexed and deformed.

The other structures and functions of the third embodiment are substantially the same as those of the first embodiment, so that the details thereof are omitted herein.

Fourth Embodiment

Figure 9:
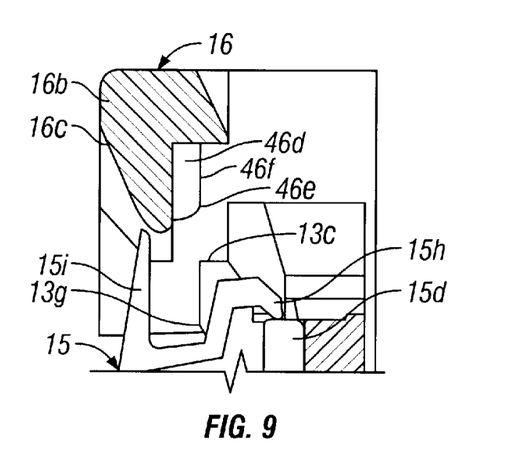
FIG. 9 is a sectional view showing a main portion of an IC socket according to a fourth embodiment of the present invention.

FIG. 9 represents a fourth embodiment of the present invention.

In this embodiment, the upper operation member 16 is provided with deformation restriction ribs 46d having a round (R) portions 46e. According to such structure, when the long side portions 16b of the upper operation member 16 is flexed and deformed inward, the round portions 46e of the deformation restriction ribs 46d slidably contact the corner portions of the partition wall sections 13c of the socket body 13 just before the most lowered position of the upper operation member 16. When the upper operation member 16 is moved further downward, the round portions 46e are slid over the corner portions thereof and perpendicular surface portions 46f of the deformation restriction ribs 46d are slid along the perpendicular surface portions 13g of the partition wall sections 13c of the socket body 13, thereby restricting the long side portions 16b of the upper operation member 16 from being flexed and deformed.

The other structures and functions of the fourth embodiment are substantially the same as those of the first embodiment, so that the details thereof are omitted herein.

It is to be noted that the present invention is not limited to the described embodiments and many other changes and modifications may be made according to the present invention without departing from the scopes of the appended claims.

For example, in the above embodiments, although the deformation restriction ribs 16d (26d, 36d, 46d) as deformation restricting means are formed to the upper operation member 16, these deformation restriction ribs may be formed to the socket body 13 so as to extend therefrom and abut against the upper operation member 16 to restrict the deformation of the upper operation member 16. Furthermore, the deformation restriction ribs may be provided for both the upper operation member 16 and the socket body 13 so as to extend therefrom and abut against the upper operation member 16 to restrict the deformation of the upper operation member 16.

Furthermore, in a structure in which the repulsive force from the contact pins act from the inner side to the outer side with respect to the upper operation member, the deformation restriction means may extend upward from the socket body and abut against the outer surface of the upper operation member to restrict the outward flexing deformation thereof. Further, the deformation restriction means may extend downward from the upper operation member and, in such structure, a portion abutting against the outer surface of the upper operation member may be formed to the socket body.

Still furthermore, in the respective embodiments, the present invention is applied to a socket for electrical parts for the IC package having the IC leads projecting toward the side portions from the opposing two side portions of the IC package, but the present invention is not limited to such structure and is applicable to a socket in which the IC package has IC leads projecting from both the opposing two side portions (in total, four side portions).

Still furthermore, although in the above embodiments, the socket of the present invention is applied to an IC socket for "electrical parts", the socket may be of course applicable to other devices.

Still furthermore, although in the above embodiments, the contact pin 15 is formed of the stationary contact piece 15b and the movable contact piece 15c (so-called, two-point contact type), the contact pin may be formed only with the movable contact piece 15C with no stationary contact piece 15b. The IC lead 12b is not limited to a gull-wing type and may be applied to another type such as straight type.

What is claimed is:

1. A socket for an electrical part comprising:
    a socket body having a mount portion on which an electrical part having a plurality of terminals is mounted;
    a plurality of contact pins arranged on the socket body and each having an elastic property, said contact pins being adapted to contact the terminals and separate therefrom, respectively,
    an operation member arranged for the socket body to be vertically movable in a mounted state, said operation member having four side portions providing a substantially rectangular frame shape, at least one of said four side portions being provided at an outer surface of said at least one of the side portions with a cam portion,
    each of said contact pins being formed with a movable contact piece, each of said movable contact pins configured for contacting each of the terminal of the electrical part, when the operation member is moved downwardly along a vertical direction, each of said movable contact pins being pressed by the cam portion of the operation member to be deformed so as to contact and separate from each of the terminals such that a repulsive force generated from the contact pin, which is pressed by the cam portion of the operation member, is applied on the cam portion; and
    deformation restriction means mounted to an intermediate portion on an inner surface of said at least one of the side portions such that at least one of said plurality of contact pins lies opposite to or outside of said deformation restriction means, a mount portion of said deformation restriction means on the inner surface being opposite to the cam portion on the outer surface, said deformation restriction means being adapted to abut against a portion of the socket body in the vicinity of the contact pin at a time when the operation member moves towards the most lowered position so as to restrict inward deformation of the operation member due to the repulsive force from the contact pin,
    wherein said deformation restriction means comprises a rib member formed on the inner surface of the at least one side portion of the operation member and adapted to abut against the socket body at a time of lowering the operation member and to restrict the inward deformation fo the operation member from occurring.

2. A socket for an electrical part according to claim 1, wherein each of said deformation restriction rib members is formed with an inclined surface portion and a perpendicular surface portion which slide along a wall section of the socket body when the operation member is lowered.

3. A socket for an electrical part according to claim 1, wherein said deformation restriction rib member has an extension which slides along a wall section of the socket body when the operation member takes an upward moved position.

4. A socket for an electrical part according to claim 1, wherein said deformation restriction rib member has a front end formed so as to provide a round shape.

5. A socket for an electrical part according to claim 1, wherein said socket is an IC socket and said electrical part is an IC package.

6. A socket for an electrical part according to claim 1, wherein said deformation restriction means is formed to a substantially central portion in the longitudinal directions of the side portion of the rectangular frame shape.

7. A socket for an electrical part according to claim 1, wherein said deformation restriction means is adapted to abut against a partition wall formed to the socket body at the time of the operation member is lowered.

8. A socket for an electrical part according to claim 1, wherein said at least one of the side portions includes at least one long side portion of the rectangular operation member, and said deformation restriction rib member is formed to an intermediate portion in a longitudinal direction of the inner surface of the long side portion of the rectangular operation member.

9. A socket for an electrical part comprising:

a socket body having a mount portion on which an electrical part having a plurality of terminals is mounted;

a plurality of contact pins arranged on the socket body and each having an elastic property, said contact pins being adapted to contact the terminals and separate therefrom, respectively, an operation member arranged for the socket body to be vertically movable in a mounted state, said operation member having four side portions providing a substantially rectangular frame shape, at least one of said four side portions being provided at a first surface with a cam portion, each of said contact pins being formed with a movable contact piece, each of said movable contact pins configured for contacting at least one corresponding terminal of the plurality of terminals of the electrical part, when the operation member is moved downwardly along a vertical direction, each of said movable contact pins being pressed by the cam portion of the operation member to be deformed so as to separate from each of the terminals such that a repulsive force generated from the contact pin, which is pressed by the cam portion of the operation member, is applied on the cam portion; and deformation restriction means mounted on an inner surface of said at least one of the side portions, a mount portion of said deformation restriction means on the inner surface being opposite to the cam portion on the first surface, said deformation restriction means being adapted to abut against the socket body at a time when the operation member takes most lowered position so as to restrict inward or outward deformation of the operation member due to the repulsive force from the contact pin, said deformation restriction means comprising a rib member formed on the inner surface of the at least one side portion of the operation member and adapted to abut against the socket body at a time of lowering the operation member and to restrict the inward deformation of the operation member from occurring, said at least one of the side portions includes a pair of long side portions of the rectangular operation member, substantially opposing to each other, and wherein said deformation restriction means comprises a plurality of deformation restriction rib members formed to intermediate portions in their longitudinal directions of the inner surfaces of the long side portions of the rectangular operation member.

10. A socket for an electrical part according to claim 9, wherein said movable contact pieces are inserted between adjacent deformation restriction rib members, respectively.

* * * * *

UNITED STATES PATENT AND TRADEMARK OFFICE
CERTIFICATE OF CORRECTION

PATENT NO.    : 6,533,595 B2
DATED         : March 18, 2003
INVENTOR(S)   : Takayuki Yamada It is certified that error appears in the above-identified patent and that said Letters Patent is hereby corrected as shown below:

<u>Column 8,</u>
Line 65, delete "fo" and insert -- of --.

Signed and Sealed this

Tenth Day of June, 2003

JAMES E. ROGAN
*Director of the United States Patent and Trademark Office*